(12) United States Patent
Bajikar et al.

(10) Patent No.: US 6,277,539 B1
(45) Date of Patent: *Aug. 21, 2001

(54) ENHANCED ADHESION FOR LIGA MICROFABRICATION BY USING A BUFFER LAYER

(75) Inventors: Sateesh S. Bajikar, San Jose, CA (US); Francesco De Carlo, Darien; Joshua J. Song, Naperville, both of IL (US)

(73) Assignee: The United States of America as represented by the United States Department of Energy, Washington, DC (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/110,738

(22) Filed: May 22, 1998

(51) Int. Cl.[7] ............................................. G03C 1/76
(52) U.S. Cl. ........................... 430/271.1; 430/270.1; 430/313; 430/314; 430/315; 430/320
(58) Field of Search .................... 430/315, 313, 430/324, 330, 322, 329, 966, 967; 250/249.2

(56) References Cited

U.S. PATENT DOCUMENTS

| | | | |
|---|---|---|---|
| 4,259,435 | * | 3/1981 | Broer et al. ........................ 430/313 |
| 4,410,664 | * | 10/1983 | Lee ...................................... 525/180 |
| 4,981,771 | * | 1/1991 | Mochiji et al. .................... 430/322 |
| 5,304,437 | * | 4/1994 | Tennant ................................. 430/5 |
| 5,378,583 | * | 1/1995 | Guckel et al. ...................... 430/325 |
| 5,858,584 | * | 1/1999 | Okabe et al. ........................ 430/18 |

OTHER PUBLICATIONS

Bednar, Bohumil; Kralicek, Jaroslav; and Zachoval, Jaromir. "Resists in Microlithiography and Printing". Materials Science Monographs , 76, section 4.5.1.1., p. 266, Aug. 19, 1993.*

"Adhesion problems in Deep–Etch X–Ray Lithography Caused by Fluorescence Radiation From the Plating Base", Pantenburg et. al ,Microelectronic Engineering 23 (1994) 223–226, Publisher Elsevier.

"Liga–fabrication of Mm–wave Linear Accelerator Cavities Using Hard Rays" Oral Presentation by Sateesh Bajikar presented Sep. 3, 1997 with copies of two slides and notice of the meeting.*

* cited by examiner

*Primary Examiner*—Janet Baxter
*Assistant Examiner*—Yvette M. Clarke
(74) *Attorney, Agent, or Firm*—Mark F. LaMarre; Mark P. Dvorscak; Virginia B. Caress

(57) ABSTRACT

The present invention is an improvement on the LIGA microfabrication process wherein a buffer layer is applied to the upper or working surface of a substrate prior to the placement of a resist onto the surface of the substrate. The buffer layer is made from an inert low-Z material (low atomic weight), a material that absorbs secondary X-rays emissions from the substrate that are generated from the substrate upon exposure to a primary X-rays source. Suitable materials for the buffer layer include polyamides and polyimide. The preferred polyimide is synthesized form pyromellitic anhydride and oxydianiline (PMDA-ODA).

11 Claims, 3 Drawing Sheets

ENHANCED ADHESION FOR LIGA MICROFABRICATION BY USING A BUFFER LAYER

STATEMENT REGARDING FEDERALLY SPONSORED RESEARCH OR DEVELOPMENT

The United States Government has rights in this invention pursuant to Contract No. W-31-109-Eng-38 between the U.S. Department of Energy and the University of Chicago representing Argonne National Laboratory.

BACKGROUND OF THE INVENTION

1. Field of the Invention

This invention relates to microfabrication of machines and machine components using photolithographic processes. More particularly, this invention relates to an improvement in the microfabrication of machines and machine parts using photolithographic processes and high energy X-rays wherein the improvement provides for increased adhesion of the resist to the substrate after exposure to high energy X-rays and subsequent development of the resist.

2. Description of Related Art

Microfabrication of engineered structures is becoming a major area of technology. These engineered structures or microengineered components as they are known are similar in shape and function to their full-sized counterparts, however, the dimensions of the microengineered components are measured in microns or tens of microns, as compared to, inches or meters for their full-sized counterparts. Examples of typical microengineered structures include; gears, pumps, rotors, and mechanical sensors. The microengineered components can be fabricated by cutting the selected building material with electron beams or lasers. Alternatively the microengineered components may be formed or cast by special processes that use a combination of photolithography and etching of silicon and thin films that are similar in many ways to semiconductor microelectronic device fabrication.

Recent developments in deep-etch lithography provide an alternative to previous microfabrication techniques. With the use of high energy X-rays (synchrotron radiation), together with an electroforming process, it is possible to fabricate microengineered components. Developed in Germany, this technique is called Lithographie, Galvanoformung, und Abformung (hereinafter "LIGA"), which is translated from German to mean synchrotron radiation lithography, galvanoforming, and plastic moulding. The process is related to the fabrication of semiconductor integrated circuits and requires similar tooling, in addition to a high-energy light source and electroplating equipment. Cavities and structural components with dimensions on the order of a millimeter can be formed with tolerances of a few microns and finishes of 100–2000 angstroms. Although synchrotron sources are sometimes available at nominal cost, obviously, the technique has high tooling costs, but after an initial investment, it allows large production quantities to be made, reproducibly and a relatively low incremental cost. The process is shown schematically in figures one to four. Secondary molds formed from the masters can be used to electroform (galvanoform) many copies of the structures, without the need of additional radiation.

"Resist" as used herein is a term of art for a coating layer for use in the manufacture of semiconductors, circuit boards, and the like. The resist is chemically modified upon exposure to radiation of a selected wavelength. A "mask" is used in combination with the resist permitting exposure of selected sections of the resist. Sections of the resist not exposed typically remain insoluble in a developer, while exposed sections become soluble in a developer. The reverse may also be the case depending on the resist/developer system. The exposed section in the present case is removed upon development. After the exposed sections of the resist have been removed, a number of chemical processes can be selectively undertaken on the underlying support.

Problems arise when the resist, typically, poly-methyl methacrylate (hereinafter "PMMA") is exposed, through a suitable mask, to high energy X-rays radiation. The high energy X-rays radiation passes through the unmasked resist or PMMA and enters the substrate. The substrate, upon exposure to the primary high energy X-rays radiation emits secondary electron emissions or photoemissions. The secondary emissions are not coherent and unidirectional like the primary high energy X-rays radiation. Secondary sources of radiation expose the shielded resist, and thereby chemically converting it in the same manner as the unmasked resist that is exposed to the primary high energy X-rays radiation. Exposures of the shielded resist occurs at the base of the resist adjacent to the resist/substrate interface. During the subsequent development of the resist, the resist exposed to the secondary emissions is removed in the same manner as the resist exposed to the primary high energy X-rays radiation.

The X-ray mask does not absorb all the radiation even in the opaque or "absorber" regions. X-rays of higher energy penetrate through the absorber portions and pass through the resist. As the resist does not absorb these higher energy X-rays significantly, it is not affected by them and the necessary contrast between the exposed and unexposed regions of the mask that permits selective dissolution is achieved. While these high energy X-rays pass through the resist without being absorbed, they are absorbed when they enter the substrate or the plating base which in typically metallic and has a higher absorption cross section at these X-ray energies than the resist. This results in the generation of secondary (auger) electrons and photoradiation at the interface of the resist and substrate in the regions under the absorber. This radiation penetrates into the resist and is absorbed at the interface within the first 3–5 micrometers. The depth to which the secondary radiation will penetrate depends on the energy of the primary synchrotron X-rays and increases with it. In addition radiation of similar origin which occurs in the exposed regions (under the clear or "carrier" portion of the mask) is non-directional and penetrated under the absorber regions. This render the interface regions of the resist under the absorber regions soluble as the regions under the carrier regions through similar chemical modifications.

This interfacial secondary radiation also causes another problem. It results in an excessive exposure of the resist under the carrier (clear) portion of the mask at the interface since the exposure there is the sum of the directly absorbed high energy X-rays and the secondary electron exposure from the interface. Over exposure of the resist results in the generation of large amounts of gases within it due to chemical modifications of the resist. These gases now begin to form bubbles in the resist at the substrate interface which results in the lifting off of the resist even before it is developed. If this problem is to be ordinarily avoided, a lower level of exposure will have to be used to avoid gas generation which will result in slower development of the resist and a reduction in contrast between the exposed and unexposed parts of the resist.

Both of these problems worsen when substrates and plating bases with large X-ray absorption cross sections are used. The desired device often does not permit arbitrary choice of material for substrate. Moreover, desirable plating bases that give good adhesion of the plated metal such as gold and substrates such as copper which is required for many devices have large absorption in the X-ray energies of relevance.

These problems do not arise when low level primary high energy X-rays sources in the range of 1 to 3 kV range are used to expose the resist since (a) the intensity of the secondary radiation is low and (b) the thickness of the secondary radiation exposed resist at the interface is extremely thin and it is difficult to dissolve this portion in the developer. However, as more powerfull high energy X-rays sources in the range of 10 to 30 kV become available and as the need arises to use these sources to fabricate thicker resists the problem will become more evident as the thickness of the secondary radiation exposed resist under the absorber becomes significant and the level of the exposure higher. One possible solution to the problem is to use thicker layers of material in the opaque (absorber) section of the photomask, however, when high energy X-rays are used the fabrication of masks with a sufficiently thick layer of gold (more than 50 micrometers) becomes difficult. Further, as the layer of opaque material is made thicker to block X-rays internal mechanical stresses increase within the mask resulting in mechanical failure of the mask.

BRIEF SUMMARY OF THE INVENTION

An object of this invention is to provide for improved adhesion between the resist and the substrate after exposure of the substrate to high energy X-rays radiation and subsequent development of the resist.

Another object of this invention is to provide a means to protect the resist from exposure to secondary electron emissions wherein the protective means is compatible with conventional X-rays lithographic techniques.

Another object of this invention is to reduce and eliminate gas bubble formation at the resist/substrate interface during exposure thereby permitting greater levels of high energy X-ray exposure for the resist and speeding up the development process and improving contrast between the exposed and unexposed regions.

These and other objectives of the invention, which will become apparent from the following description, have been achieved by a novel process and structure for use with the microfabrication of engineered components. The process of this invention for microfabrication of engineered components comprises: applying a buffer layer to the working surface of a substrate for the microfabricated structure, then applying a resist to the working surface of the buffer layer to form a microfabrication blank. The buffer layer for use in the process of this invention is made from a material that is stable under exposure to a primary high energy X-rays source and capable of absorbing secondary electron emissions generated by the substrate upon exposure to an high energy X-rays source. The resist for use with the process of this invention is any resist that is suitable for X-rays applications. The resist is chemically modified upon exposure to X-rays, such that, upon subsequent development that part of the resist not exposed to X-rays remains intact while the section of the resist exposed to the X-rays is removed. An X-rays mask is provided and aligned in spaced relationship to the blank so that the two-dimensional image that is projected onto the surface of the resist will generate the desired three-dimensional structure upon exposure to X-rays and subsequent development of the resist. The mask and blank are then exposed to a primary high energy X-rays source to produce an exposed blank, thereby chemically modifying the unmasked section of the resist. The blank is developed to remove the chemically modified part of the resist forming a microstructure. Finally, the section of the buffer not covered by the unmodified resist maybe removed if needed to form the desired microfabricated component.

Additionally, the microfabrication process may comprise the further steps of; electroplating said microstructure; removing the remaining resist; and removing the remaining buffer layer.

A suitable substrate may be composed of, for example, but not limited to silicon, copper, or gallium-arsinide. The buffer layer may be applied directly to the working surface of the substrate or a plating base may be deposited onto the working surface of the substrate prior to the application of the buffer layer. The plating base may be any suitable material such as copper, gold, nickel, or chromium.

The buffer layer for use with the process of this invention is one that is stable under exposure to a primary high energy X-rays source and capable of absorbing secondary electron emissions generated by the substrate upon exposure to an X-rays source. Further, the resist should be made thick enough so that the secondary electron emissions do not penetrate through it into the resist. The buffer layer should also have X-ray absorption properties close to that of the resist to avoid over or underexposures of the buffer layer/resist interface. In addition, the material from which the buffer layer is fabricated should not generate much gas within it upon exposure to high energy X-rays or secondary electron radiation. With respect to the processing aspects, the buffer layer should be able to be removed or etched without damage to the resist or the substrate and plating base, and be easily applied or coated onto a variety of plating bases/substrates and have good adhesion to them and to the resist. Polymer materials such as, but not limited to polyamides or polyimides are suitable for this use. Preferably the polyimide is synthesized from pyromellitic dianhydride and oxydianiline, commonly referred to as PMDA-ODA. The buffer layer may comprise a layer of a polyamide and a layer of a hard-baked resist in order to promote chemical adhesion between the buffer layer and the resist. A hard-baked UV resist such as AZ1828 is suitable for this use. The buffer layer may be modified and roughened to promote mechanical adhesion between the buffer layer and resist by a brief oxygen plasma etch or other roughening processes.

The process for microfabrication of engineered structures of this invention is suitable for use with primary high energy X-rays sources in the range of from about 5 kilovolts to about 30 kilovolts, and preferably, primary high energy X-rays sources in the range of from about 10 kilovolts to about 20 kilovolts. The energy level of these primary high energy X-rays sources is understood to mean that 50 percent of the x-rays are above this energy level and 50 percent below this level.

The microengineering blank manufactured by the process of this invention comprises; a substrate having a working surface; a buffer layer having a working surface and a base wherein the base of the buffer layer is affixed to the working surface of the substrate; and an X-rays resist affixed to the working surface of the buffer layer. The material from which the buffer layer is fabricated should be substantially stable upon exposure to a primary high energy X-rays source and capable of absorbing secondary electron emissions generated by the substrate upon exposure to a primary high energy X-rays source. Upon exposure of said blank to a primary high energy X-rays source the resist is chemically modified by the high energy X-rays such that the chemically modified X-rays resist can be removed in subsequent process without removal of the unexposed resist. The buffer layer absorbs a sufficient amount of secondary electron radiation so that portion of the resist not exposed directly to the primary X-rays source is not chemically modified by exposure from secondary electron radiation which emanates from the substrate. Additionally, a plating base may be deposited onto the working surface of the substrate prior to the application of the buffer layer. The buffer layer of this invention may be a polyamide or polyimide. The buffer layer may comprise more than one layer, for example, the buffer layer comprises a layer of a polyamide and a layer of a hard-baked resist. The hard-baked resist is preferably a novolac-based UV photoresist.

BRIEF DESCRIPTION OF THE SEVERAL VIEWS OF DRAWINGS

With this description of the invention, a detailed description follows with reference being made to the accompanying figures of drawings which form part of the specification, in which like parts are designated by the same reference numbers, and of which:

The invention is not limited in its application to the details and construction and arrangement of parts illustrated in the accompanying drawings since the invention is capable of other embodiments that are being practiced or carried out in various ways. Also, the phraseology and terminology employed herein are for the purpose of description and not of limitation.

DESCRIPTION OF THE PRIOR ART

Figure 1:
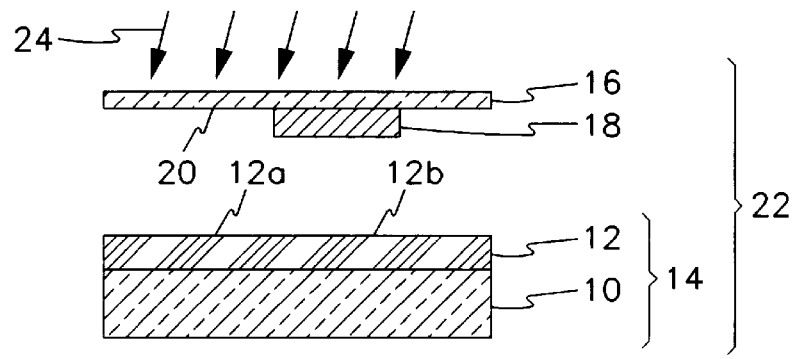
FIGS. 1, 1a, 2, 2a, 3 and 4 are schematic cross-sectional views of the standard X-rays lithographic process.
Figure 2:
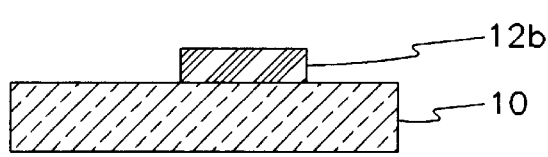
Figure 3:
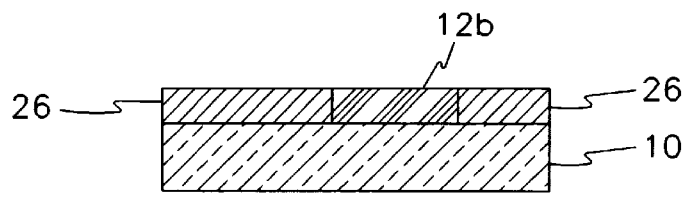
Figure 4:
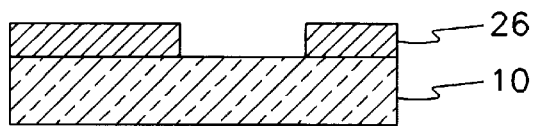

The conventional LIGA process is shown in FIGS. 1 to 4. In the conventional process a substrate 10 is covered with an X-rays resist 12, which is typically PMMA. The combination of the substrate 10 and the resist 12 forms a conventional X-rays blank 14. An X-rays mask 16 containing an X-rays opaque zone (absorber) 18 and an X-rays transparent (carrier) zone 20 is aligned in spaced relationship to the conventional blank 14 to form a conventional X-rays lithographic system 22. The conventional X-rays lithographic system 22 is then exposed to a primary X-rays source 24. That portion of the resist 12 exposed to X-rays is chemically modified. Upon development, as shown in FIG. 2, the chemically modified resist 12a is removed leaving the unexposed X-rays resist 12b. A metal layer 26 may subsequently be deposited on the substrate 10. The unexposed X-rays resist 12b can then be stripped or remove in a subsequent step, typically by reexposure to X-rays radiation without the use of an X-rays mask followed by development of the resist.

Figure 1A:
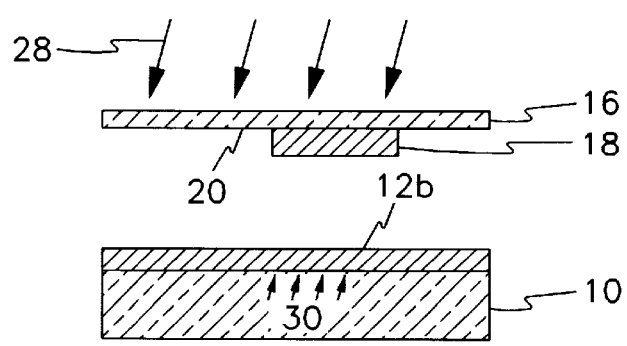
Figure 2A:
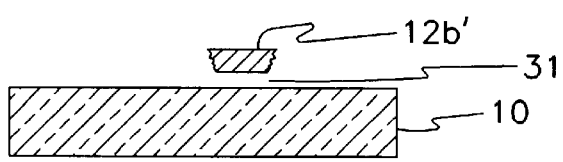
Figure 5:
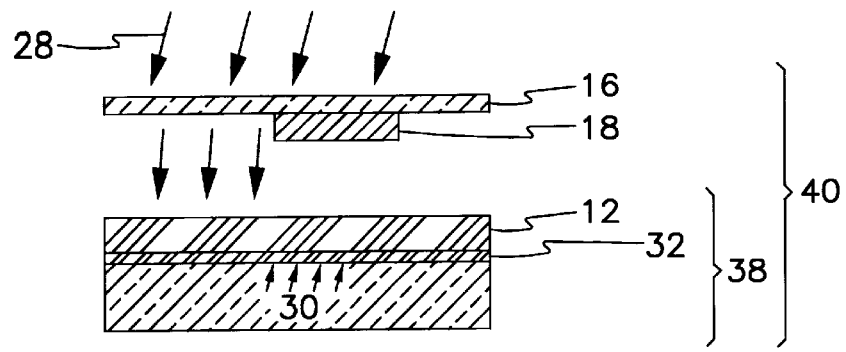
FIGS. 5 to 10 are schematic cross-sectional views of the modified X-rays lithographic process under this invention.

When a high energy X-rays source 28 is used, as shown in FIG. 1a, secondary electron emissions 30 are generated by the primary high energy X-rays entering the substrate. As referred to herein a high energy X-rays source is a source that emits X-rays in excess of 5 kV. That part of the X-rays resist 12 not exposed 12b to the high energy primary X-rays source 28 directly, is now exposed to the secondary electron emissions 30. Exposure of the resist 12 to secondary X-rays emissions 30 produces a second zone of chemically modified resist 12b'. Upon development, as shown in FIG. 2a, the second zone of chemically modified resist 12b' is partially or completely removed in the same manner as that section of the substrate 12 that has been chemically modified 12a by direct exposure to the high energy X-rays source 28. The unpredictable and erratic chemical conversion of the resist 12 results in the second zone of chemically modified resist 12b' being formed in other than the desired shape or worse, in a complete loss of adhesion between the resist and substrate as indicated at 31.

DETAILED DESCRIPTION OF THE INVENTION

Description of the Preferred Embodiments

Figure 6:
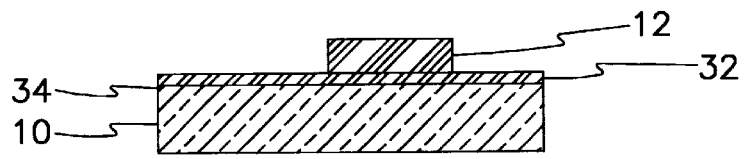
Figure 7:
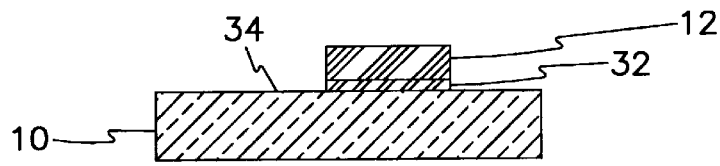
Figure 8:
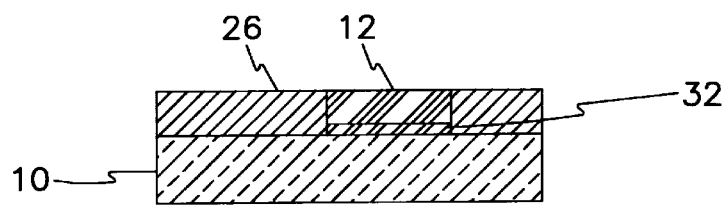
Figure 9:
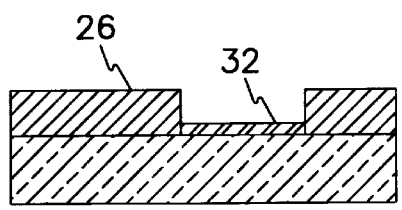
Figure 10:
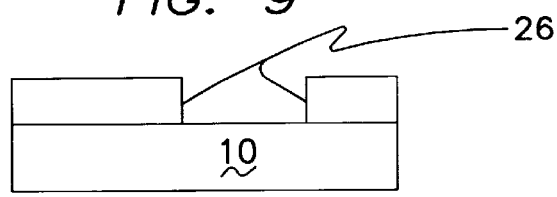

In the novel process of this invention, as shown in FIGS. 5–10, a buffer layer 32 is applied to the working surface 34 of substrate 10. An X-rays resist 12, is applied to the upper surface 36 of the buffer layer 32. The combination of the substrate 10, the buffer layer 32, and the X-rays resist 12 forms the modified X-rays blank 38 of this invention. An X-rays mask 16 is aligned over the modified X-rays blank 38 of this invention to form the modified LIGA system 40 of this invention. The modified LIGA system 40 is then exposed to a high energy X-rays source 28. The secondary electron emission 30 generated by the substrate 10 upon exposure to a high energy X-rays source 28 are absorbed by the buffer layer 32. That portion of the resist 12 that is exposed to X-rays is chemically modified. Upon development, as shown in FIG. 6, the chemically modified resist 12a is removed leaving the unexposed resist 12b. The buffer layer 32 is then removed through oxygen reactive ion etching/plasma etching. A metal layer 26 may subsequently be electroplated on the substrate 10. The unexposed resist 12b can then be stripped or remove in a subsequent step, typically by reexposure to X-rays radiation without the use of an X-rays mask followed by development. The section of the buffer layer 32 covered by the unexposed resist 12b is removed by reactive ion etching/plasma etching.

The LIGA process for use with this invention is the standard lithographic type process used for the manufacture of microengineered mechanical components. The LIGA process uses process steps similar to the formation of microelectronic circuits. These steps include, but are not limited to the preparation of a substrate in a "clean room environment," the placement of a resist on the working surface of the resist where the resist can be chemically modified upon exposure to a suitable wavelength or wavelengths of electromagnetic radiation, exposure of the resist to radiation, removal of the unaltered resist, and chemical treatment of the substrate at locations where the resist has been removed.

Figure 11:
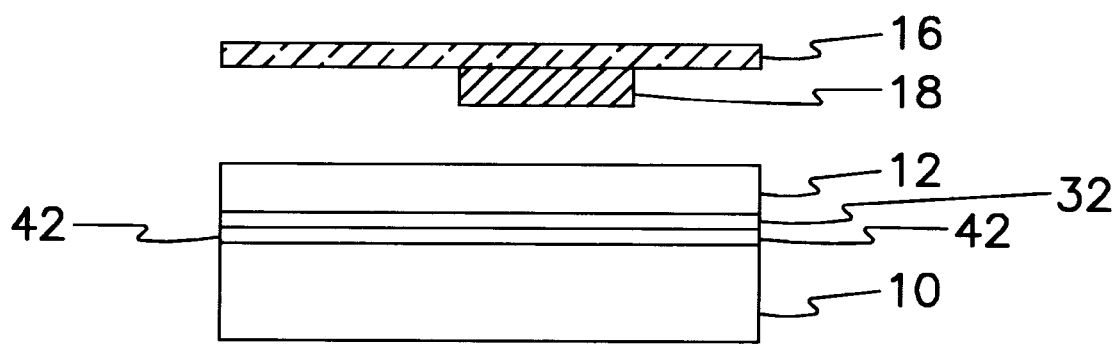
FIG. 11 is a cross-sectional view of a substrate coated with a metal or oxide layer.

The substrate for use with this invention may be any suitable substrate for use with the LIGA process. A suitable substrate is a bare metal or silicon which will normally accept an electroplated or electrodeposited coating or can be machined to accept such a coating. These substrates include, but are not limited to silica, silicon coated with a chromium/gold plating base to enable adhesion of the plated metal to the substrate, silicon, copper, and other metals. The substrate may be coated with any suitable coating to improve the nature of the finished product. For example, as shown in FIG. 11, a substrate 10 of silicon dioxide is coated with a substrate coating layer 42 of titanium dioxide to improve mechanical adhesion between the substrate 10 and the buffer layer 32. The substrate 10 may also be made of a semiconductive material, such as silicon, coated with a conductive metal layer such as copper or gold.

The buffer layer 32 for use with this invention is any suitable material that can absorb secondary electron emissions in the range of 1.0 to 30-keV. The buffer layer is made from an inert low-Z material (low atomic weight), a material that absorbs secondary electron emissions from the substrate that are generated from the substrate upon exposure to a primary X-rays source. The buffer layer for use with the process of this invention is one that is stable under exposure to a primary X-rays source and capable of absorbing secondary electron emissions generated by the substrate upon exposure to an X-rays source. Further, the buffer layer should be made thick enough so that the secondary electron emissions do not penetrate through it into the resist. The buffer layer should also have X-ray absorption properties close to that of the resist to avoid over or underexposures of the buffer layer/resist interface. In addition, the material from which the buffer layer is fabricated should not generate much gas within it upon exposure to X-rays or secondary electron radiation. With respect to the processing aspects, the buffer layer should be able to be removed or etched without damage to the resist or the substrate and plating base, and be easily applied or coated onto a variety of plating bases/substrates and have good adhesion to then and to the resist.

Figure 12:
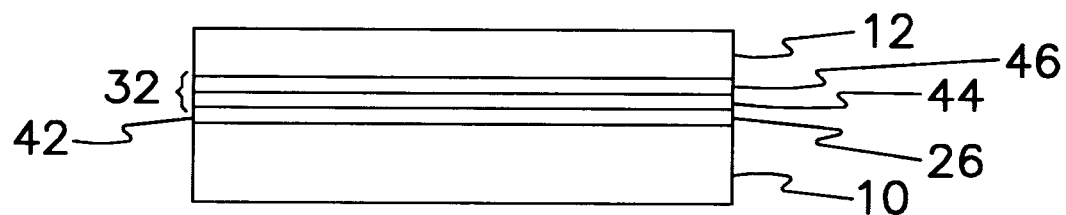
FIG. 12 is a cross-sectional view of the X-rays blank of this invention showing a metal coated substrate and a multi-layer resist.

Typically a polymer material such as, but not limited to polyamides or polyimides are suitable for this use. Preferably the polyimide is synthesized from pyromellitic dianhydride and oxydianiline, commonly known as PMDA-ODA, sold by Dupont under the name Pyralin® Polyamide Resin PI2545. The total thickness of the buffer layer 32 is of the order of the penetration length of the secondary electron emission or photoelectrons. The buffer layer 32 is typically from about 0.05 $\mu$m (0.05×10$^{-6}$ m) to about 3.0 $\mu$m for a primary X-rays source of about 10 keV. Preferably, the buffer layer 32 is typically from about 0.2 $\mu$m (0.2×10$^{-6}$ m) to about 2 $\mu$m. In order to improve adhesion between the buffer layer and the resist, or improve removal ease, the buffer layer 32 may be made from more than one layer, as shown in FIG. 12. Preferably, the buffer layer 32 comprises a first buffer layer 44 made from a polyamide or polyimide, and a second buffer layer 46 made of a typical commercial photoresist. An example of, but not limited to, a typical photoresist is a hard-baked resist, such as AZ1828 manufactured by Shipley of Marlborough, Mass. Generically AZ1828 is a novolac-based UV-resist. The photoresist may be thinned with an appropriate solvent, such as Microposit Type P Thinner Manufactured by Shipley, in order to permit application of the thinner layer. The hard baked resist may not have the high stability to secondary electron exposure of the polyamide or polyimide. However, in conjunction with the polyamide or polyimide the X-rays emissions reaching the resist 12 are sufficiently reduced so that the resist 12 remains in tact during development. The buffer layer may be further modified by roughing it using and oxygen plasma or other processes in order to enhance the resists adhesion to it.

The buffer layer 32 is applied to the substrate 10 by a process known in the semiconductor industry as "spin coating." Typically, a first buffer layer 44 of a polyimide is spun onto the surface of the substrate 10 to a thickness of about 0.5 $\mu$m. A second buffer layer 46, typically a UV hard-baked resist such as AZ1828, is spun onto the surface of the first buffer layer 44 to a thickness of 0.5 $\mu$m to form a total buffer layer 32 thickness of from about 2.5 $\mu$m to about 3.0 $\mu$m. To spin the polyamide to the proper thinness it may be necessary to dilute the polyimide with a suitable solvent. In the case when the polyimide is synthesized from pyromellitic dianhydride and oxydianliine the suitable solvent is 1-methyl-2 pyrralidinome.

The buffer layer 32 of this invention can also be used with a resist 12 that is soluble prior to exposure to X-rays radiation and becomes insoluble upon exposure to X-rays radiation. The subsequent development of the resist 12 results in the removal of the unexposed resist. A lithographic system using this type of resist 12 would result in the reverse of that in appearing in FIG. 5 and 6.

Tests were conducted using a resolution mask having randomly distributed 50–100 $\mu$m column/hole mask to expose, with the same beamline configuration, different substrates. The substrates were prepared having 15, 30, and 45 NM AU as a plating base and 1 mm glued/150 $\mu$m spin coated PMMA. A thin layer of a monomer, methyl methacrylate, is applied to the buffer layer to act as the glue between the buffer layer and the resist. All substrates were prepared with the optimized buffer layer vis. a 2.5 $\mu$m thick polyimide. No differences were observed among the different Au plating base substrates of various thicknesses. A resolution mask exposure onto a ~1 mm PMMA glued substrate produced an attached structure with a 2 $\mu$m cross-section. The aspect ratio in this case is ~475. The aspect ratio is the height divided by the width. A resolution mask exposure onto a ~2.5 mm PMMA glued substrate produced an attached structure with a cross-section of 20 $\mu$m. The aspect ratio in this case is ~125. The maximum aspect ratio achieved with conventional X-rays lithography is ~100.

The buffer layer has also improved the adhesion of structures exposed with poor contrast masks. Graphite masks were replicated in 1 mm PMMA using a Pt mirror (high energy) and a mask with gold absorber of 15 $\mu$m. For substances prepared without the buffer layer, the adhesion loss observed can be explained by the excess dose in the adhesion layer, which results from fluorescence and secondary electron emission. This secondary emission is generated by the high-z plating base absorbing high energy X-rays that penetrate the gold absorber. 1 mm PMMA structures using the buffer layer exposed with the same condition exhibited no adhesion loss.

Thus, in accordance with the invention, a means is provided to reduce and eliminate gas bubble formation at the resist/substrate interface during exposure thereby permitting greater levels of X-ray exposure for the resist and speeding up the development process and improving contrast between the exposed and unexposed regions. Also, there has been provided a means for improved adhesion between the resist and the substrate after exposure of the substrate to high energy X-rays radiation and subsequent development of the resist. Additionally, there has been provided a means to protect the resist from exposure to secondary electron emissions wherein the protection means is comparable with conventional X-rays lithographic techniques With this description of the invention in detail, those skilled in the art will appreciate that modification may be made to the invention without departing from the spirit thereof. Therefore, it is not intended that the scope of the invention is limited to the specific embodiments that have been illustrated and described. Rather, it is intended that the scope to the invention is determined by the scope of the appended claims.

We claim:

1. A process for microfabrication of engineered structures comprising:

providing a substrate for the microfabricated structure, said substrate having a working surface for receiving a resist;

providing a buffer layer which is stable under exposure to and capable of absorbing secondary electron emissions generated by the substrate upon exposure to an X-rays source, wherein adhesion is maintained between the buffer layer and the resist upon exposure to an X-rays source, and affixing the buffer layer to the said working surface of said substrate, wherein the buffer layer comprises a first layer and a second layer of a hard-baked resist wherein the first layer is made from a polymer material having a low atomic weight;

providing a resist that is chemically modified upon exposure to X-rays and affixing the resist to the buffer layer to form a blank;

providing an X-rays mask that upon exposure to a source of X-rays will permit the chemical modification of selected portions of said resist to produce a two-dimensional outline of the desired structure;

exposing the mask and blank to a primary x-rays source to produce an exposed microfabricated blank where the section of the blank not protected from the X-rays source by the mask is chemically modified;

developing the blank to remove the chemically modified part of the resist; and removing the section of the buffer not covered by the remaining resist to form amicro structure.

2. The process for microfabrication of engineered structures of claim 1 further comprising deposition of a plating base onto the working surface of said substrate prior to the application of the buffer layer.

3. The process for microfabrication of engineered structures of claim 1 wherein the polymer material is a polyamide or polyimide.

4. The process for microfabrication of engineered structures of claim 3 where the polyimide is synthesized from pyromellitic dianhydride and oxydianline.

5. The process for microfabrication of engineered structures of claim 1 wherein the buffer layer is roughened to enhance adhesion of the resist to the buffer layer.

6. The process for microfabrication of engineered structures of claim 1 wherein the buffer layer comprises a layer of a polyamide and a layer of a hard-baked resist.

7. The process of claim 6 wherein the hard-baked resist is a UV-photoresist.

8. The process for microfabrication of engineered structures of claim 1 further comprising:

electroplating said micro structure;

removing the remaining resist; and removing the remaining buffer layer.

9. The process for microfabrication of engineered structures of claim 1 wherein the primary X-rays source in the range of from about 10 kilovolts to about 20 kilovolts.

10. The process for microfabrication of engineered structures of claim 1 wherein the substrate is selected from the group consisting of silicon, copper, and gallium-arsinide.

11. The process for microfabrication of engineered structures of claim 1 wherein the primary X-rays source in the range of from about 5 kilovolts to about 30 kilovolts.

* * * * *